US010553282B2

(12) United States Patent
Darla et al.

(10) Patent No.: US 10,553,282 B2
(45) Date of Patent: Feb. 4, 2020

(54) CONTENT ADDRESSABLE MEMORY CELL AND ARRAY

(71) Applicant: International Business Machines Corporation, Armonk, NY (US)

(72) Inventors: Ananth Nag Raja Darla, Bangalore (IN); Praveen Patavardhan, Bangalore (IN); Gordon B. Sapp, Austin, TX (US); Rolf Sautter, Bondorf (DE)

(73) Assignee: International Business Machines Corporation, Armonk, NY (US)

( * ) Notice: Subject to any disclaimer, the term of this patent is extended or adjusted under 35 U.S.C. 154(b) by 2 days.

(21) Appl. No.: 14/823,503

(22) Filed: Aug. 11, 2015

(65) Prior Publication Data
US 2016/0049198 A1    Feb. 18, 2016

(30) Foreign Application Priority Data

Aug. 14, 2014 (GB) .................................. 1414424.0

(51) Int. Cl.
*G11C 15/04* (2006.01)
(52) U.S. Cl.
CPC .................................. *G11C 15/04* (2013.01)
(58) Field of Classification Search
CPC ....................................................... G11C 15/04
USPC .......................................................... 365/49
See application file for complete search history.

(56) References Cited

U.S. PATENT DOCUMENTS

| 4,723,224 A | * | 2/1988 | Van Hulett | ....... G06F 17/30982 |
| | | | | 365/154 |
| 5,907,867 A | * | 5/1999 | Shinbo | ................ G06F 12/1027 |
| | | | | 711/207 |
| 6,163,473 A | * | 12/2000 | Hannunn | ............... G11C 15/04 |
| | | | | 365/230.05 |

(Continued)

FOREIGN PATENT DOCUMENTS

GB        2529221 A  *  2/2016  ............. G11C 15/04

OTHER PUBLICATIONS

Eshraghian et al., Memristor MOS Content Addressable Memory (MCAM): Hybrid Architecture for Future High Performance Search Engines, IEEE Transactions on Very Large Scale Integration (VLSI) Systems, vol. X, No. X,—201X, May 11, 2010, pp. 1-10.

*Primary Examiner* — Mushfique Siddique
(74) *Attorney, Agent, or Firm* — Lieberman & Brandsdorfer, LLC (57) ABSTRACT

A content addressable memory (CAM) cell system is provided. The CAM cell system includes a first memory cell, a first logic circuitry and a first compare circuitry. The first logic circuit includes a first n-FET, a first p-FET, and a first input terminal. A gate of the first n-FET and a gate of the first p-FET are galvanically coupled to the first input terminal. The first compare circuitry is communicatively coupled to the first memory cell via a first coupling, and to the first input terminal via a second coupling. The first compare circuitry is configured to receive first data stored in the first memory cell via the first coupling, receive first match data, transmit a first binary logical value to the first input terminal via the second coupling in response to the first data not matching the first match data, and transmit a second binary logical value to the first input terminal via the second coupling in response to the first data matching the first match data.

19 Claims, 8 Drawing Sheets

(56) References Cited

U.S. PATENT DOCUMENTS

| | | | | |
|---|---|---|---|---|
| 6,373,738 B1* | 4/2002 | Towler | | G11C 15/04 365/189.07 |
| 6,373,739 B1* | 4/2002 | Lien | | G11C 15/04 365/168 |
| 6,460,112 B1* | 10/2002 | Srinivasan | | G11C 15/04 365/168 |
| 6,499,081 B1* | 12/2002 | Nataraj | | G11C 15/04 365/189.07 |
| 6,539,455 B1* | 3/2003 | Khanna | | G11C 15/04 365/49.17 |
| 6,574,702 B2* | 6/2003 | Khanna | | G11C 15/04 365/189.07 |
| 6,760,241 B1* | 7/2004 | Gharia | | G11C 15/043 365/189.07 |
| 6,801,981 B1 | 10/2004 | Pereira et al. | | |
| 6,845,026 B1* | 1/2005 | Gharia | | G11C 15/04 365/159 |
| 7,881,125 B2 | 2/2011 | Srinivasan et al. | | |
| 7,920,399 B1 | 4/2011 | Nataraj et al. | | |
| 8,631,195 B1 | 1/2014 | Khanna et al. | | |
| 2001/0033508 A1* | 10/2001 | Waller | | G11C 15/043 365/49.17 |
| 2003/0161209 A1* | 8/2003 | Gillingham | | G11C 15/04 365/227 |
| 2006/0171183 A1* | 8/2006 | Lysinger | | G11C 15/04 365/49.1 |
| 2009/0034311 A1* | 2/2009 | Bosshart | | G11C 15/04 365/49.17 |
| 2009/0310395 A1* | 12/2009 | Chiang | | G11C 15/04 365/49.17 |
| 2010/0067277 A1* | 3/2010 | Chiang | | G11C 15/04 365/49.17 |
| 2010/0182816 A1* | 7/2010 | Burda | | G06F 17/30982 365/49.17 |
| 2010/0328982 A1* | 12/2010 | Kim | | G11C 15/04 365/49.17 |
| 2013/0054886 A1 | 2/2013 | Eshraghian et al. | | |
| 2016/0189769 A1* | 6/2016 | Jeloka | | G11C 11/419 365/154 |

\* cited by examiner

Fig. 1

| | TRU_1 | CMP_1 | CBLT_1 | CBLC_1 | BITMCH_2 | FUNCTION |
|---|---|---|---|---|---|---|
| 150 → | 0 | 1 | 0 | 1 | 1 | MATCH |
| 151 → | 0 | 1 | 1 | 0 | 0 | MISMATCH |
| 152 → | 0 | 1 | 0 | 0 | 1 | MASK |
| 153 → | 0 | 1 | 1 | 1 | 0 | POWERGATING |
| 154 → | 1 | 0 | 0 | 1 | 0 | MISMATCH |
| 155 → | 1 | 0 | 1 | 0 | 1 | MATCH |
| 156 → | 1 | 0 | 0 | 0 | 1 | MASK |
| 157 → | 1 | 0 | 1 | 1 | 0 | POWERGATING |

| | INPUT_1 | OUTPUT_1 |
|---|---|---|
| 210 → | 0 | 1 |
| 211 → | 1 | 0 |

| | INPUT_2 | INPUT_1 | OUTPUT_2 |
|---|---|---|---|
| 300 → | 0 | 0 | 1 |
| 301 → | 0 | 1 | 1 |
| 302 → | 1 | 0 | 1 |
| 303 → | 1 | 1 | 0 |

| | BITMATCH_4 | BITMATCH_2 | OUTPUT_4 |
|---|---|---|---|
| 500 → | 0 | 0 | 1 |
| 501 → | 0 | 1 | 1 |
| 502 → | 1 | 0 | 1 |
| 503 → | 1 | 1 | 0 |

|  | INPUT_2 | INPUT_1 | INPUT_3 | OUTPUT_5 |
|---|---|---|---|---|
| 600 → | 0 | 0 | 0 | 1 |
| 601 → | 0 | 0 | 1 | 0 |
| 602 → | 0 | 1 | 0 | 1 |
| 603 → | 0 | 1 | 1 | 0 |
| 604 → | 1 | 0 | 0 | 1 |
| 605 → | 1 | 0 | 1 | 0 |
| 606 → | 1 | 1 | 0 | 0 |
| 607 → | 1 | 1 | 1 | 0 |

| SRAM_CELL_3   122a | SRAM_CELL_1   108a | SRAM_CELL_2   113a |
|---|---|---|
| COMPARE_CIRCUITRY_3 125a | COMPARE_CIRCUITRY_1 109a | COMPARE_CIRCUITRY_2 116a |
| LOGIC_CIRCUITRY_3   128a | LOGIC_CIRCUITRY_1 111a | LOGIC_CIRCUITRY_2   118a |

CONTENT ADDRESSABLE MEMORY CELL AND ARRAY

CROSS-REFERENCE TO RELATED APPLICATION(S)

This application claims priority under 35 U.S.C. § 119 from Great Britain Application No. 1414424.0, filed on Aug. 14, 2014, the entire contents of which are incorporated by reference herein.

BACKGROUND

Technical Field

The present embodiments generally relate to content addressable memory cells. More specifically, the present embodiments relate to the design and layout of content addressable memory cells.

Description of the Prior Art

Content addressable memory cells (CAMs) are widely used in applications where extremely fast searching of data is required. For instance, memory based on CAM cells can be used to quickly address content in a database. The memory based on CAM cells can compare input search data (tag) against a table of stored data and return an address of matching data in the database. In contrast to dynamic random access memory (DRAM), wherein each cell consists of a single transistor and a single capacitor, the CAM cell comprises multiple transistors performing data write and data compare functions. Further, the CAM cells are united by a plurality of various logical gates for performing logical functions on match results generated by each of the CAM cells. Thus in contrast to DRAM memory the memory based on CAM cells requires optimum allocation on a die of various components of the CAM cells and the logical gates as well.

SUMMARY

The aspects described herein comprise a CAM cell system, a method, and a computer program product.

According to one aspect, a content addressable memory (CAM) cell system is provided. The system includes a first memory cell, a first logic circuit and a first compare circuit. The first logic circuit includes a first n-FET, a first p-FET, and a first input terminal. A gate of the first n-FET and a gate of the first p-FET are galvanically coupled to the first input terminal. The first compare circuit is communicatively coupled to the first memory cell via a first coupling, and to the first input terminal via a second coupling. The first compare circuit is configured to receive first data stored in the first memory cell via the first coupling, receive first match data, transmit a first binary logical value to the first input terminal via the second coupling in response to the first data not matching the first match data, and transmit a second binary logical value to the first input terminal via the second coupling in response to the first data matching the first match data.

According to another aspect, a method for operating a CAM cell is provided. The CAM cell comprises a first memory cell and a first compare circuitry. The method includes the first compare circuitry receiving first data stored in the first memory cell, receiving first match data, transmitting a first binary logical value to a first input terminal in response to the first data not matching the first match data, and transmitting a second binary logical value to the first input terminal in response to the first data matching the first match data. The first binary logical value and the second binary logical value are inverted.

According to yet another aspect, a computer program product provided to generate a machine-executable representation of a CAM cell The CAM cells comprises a first memory cell and a first compare circuitry. The computer program product comprising a machine-readable storage medium having computer readable program code embodied thereon, which when executed causes a computer to implement a method comprising the first compare circuitry receiving first data stored in the first memory cell, receiving first match data, transmitting a first binary logical value to a first input terminal if the first data does not match the first match data, and transmitting a second binary logical value to the first input terminal if the first data matches the first match data. The first binary logical value and the second binary logical value are inverted.

These and other features and advantages will become apparent from the following detailed description of the presently preferred embodiment(s), taken in conjunction with the accompanying drawings.

BRIEF DESCRIPTION OF THE SEVERAL VIEWS OF THE DRAWINGS

The drawings referenced herein form a part of the specification. Features shown in the drawings are meant as illustrative of only some embodiments, and not of all embodiments unless otherwise explicitly indicated. Implications to the contrary are otherwise not to be made.

DETAILED DESCRIPTION

It will be readily understood that the components of the present invention, as generally described and illustrated in the Figures herein, may be arranged and designed in a wide variety of different configurations. Thus, the following detailed description of the embodiments of the apparatus, system, and method of the present invention, as presented in the Figures, is not intended to limit the scope of the invention, as claimed, but is merely representative of selected embodiments of the invention.

Reference throughout this specification to "a select embodiment," "one embodiment," or "an embodiment" means that a particular feature, structure, or characteristic described in connection with the embodiment is included in at least one embodiment of the present invention. Thus, appearances of the phrases "a select embodiment," "in one embodiment," or "in an embodiment" in various places throughout this specification are not necessarily referring to the same embodiment.

Furthermore, the described features, structures, or characteristics may be combined in any suitable manner in one or more embodiments. In the following description, numerous specific details are provided, such as examples of sensors, detectors, etc., to provide a thorough understanding of the embodiments. One skilled in the relevant art will recognize, however, that the embodiments can be practiced without one or more of the specific details, or with other methods, components, materials, etc. In other instances, well-known structures, materials, or operations are not shown or described in detail to avoid obscuring aspects of the embodiments.

The illustrated embodiments of the invention will be best understood by reference to the drawings, wherein like parts are designated by like numerals throughout. The following description is intended only by way of example, and simply illustrates certain selected embodiments of devices, systems, and processes that are consistent with the invention as claimed herein.

In the following description of the embodiments, reference is made to the accompanying drawings that form a part hereof, and which shows by way of illustration the specific embodiment in which the embodiment may be practiced. It is to be understood that other embodiments may be utilized because structural changes may be made without departing from the scope of the present embodiment(s).

Communicative coupling, as understood here, provides data transmission between terminals of various components of digital circuitry such as transistors, logic gates, functional digital logic blocks, etc. The communicative coupling may be implemented by any means applicable for digital data transmission on semiconductor chips. It may be performed by other transistors, and/or other logical gates, and/or functional digital blocks, and/or galvanic couplings between the terminals.

Galvanic coupling, as understood here, provides data transmission between terminals of various components of digital circuitry such as transistors, logic gates, functional digital logic blocks, etc. It is implemented by low-resistance wiring elements connecting the terminals. Resistance of such galvanic couplings is below a 10 Ohm, preferably below 1 Ohm. The wiring elements can be made of heavily/degenerately doped semiconductor, and/or metals, and/or metal nitrides.

The embodiments described herein fill the need of providing a fast operating CAM cell having compact layout, an array of the CAM cells, a method for operating the CAM cell, a method for operating the array of CAM cells, and a hardware description language (HDL) design structure encoded on a machine-readable data storage medium, wherein the HDL design structure comprises elements which, when processed in a computer-aided design system, generate a machine-executable representation of the CAM cell and/or array of the CAM cells. Several inventive embodiments are described below. Preferred embodiments are described in the corresponding claims.

With the advent of complex logic functions needed for processing of matching results of individual CAM cells in arrays of the CAM cells, a new problem has emerged. Logic circuitry performing said functions has to be allocated as close as possible to the CAM cells, transistor circuitry performing these functions has to be properly distributed among the CAM cells, and design of the CAM cell has to support a lot of variations corresponding to the various logic functions. The following embodiments address this problem. It enables for easy integration of such CAM cells in arrays, wherein various complex functions mentioned above are implemented by selecting a proper first metal wiring layout and a proper layout of heavily/degenerately doped regions of semiconductor wafer for galvanic couplings of terminals of a few transistors of each of the CAM cells in the array. As it will be further illustrated, various logical gates like invertor, NAND, NOR, AOI, etc. can be implemented by using proper wiring configuration, without changing the layout of the CAM cell transistors themselves.

Figure 1:
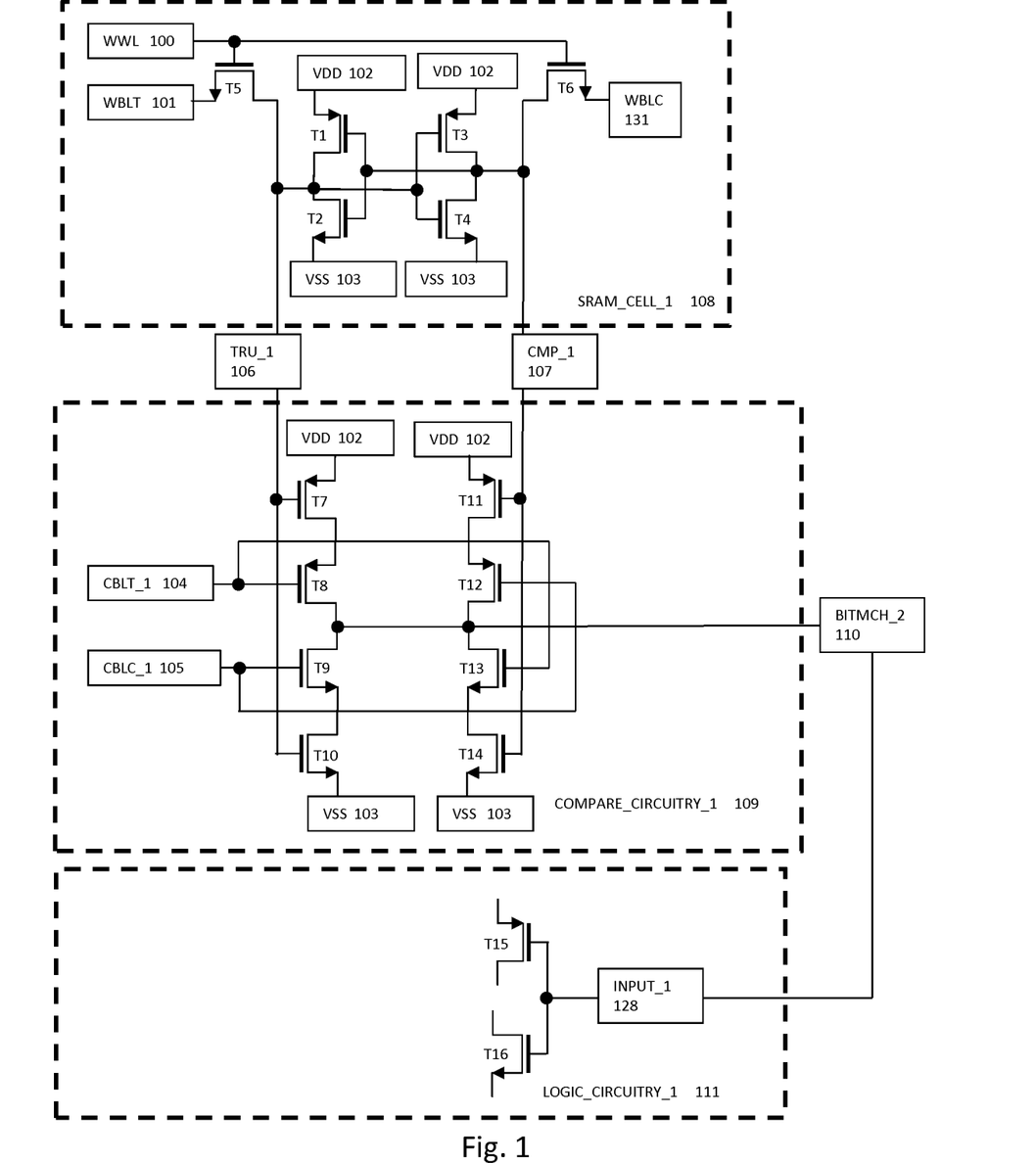
FIG. 1 shows a circuit diagram of a CAM cell.

FIG. 1 illustrates a circuit diagram of a CAM cell. It comprises three major components: transistor static random access memory (SRAM) cell (108), compare circuitry (109), and logic circuitry (111). The first SRAM cell (108) comprises six transistors (T1)-(T6). It has three terminals for operation WWL (100), WBLT (101), and WBLC (131). The first SRAM cell (108) is communicatively coupled to compare circuitry (109) via a first communicative coupling TRU_1 (106) and CMP_1 (107). The first communicative coupling is configured to transmit data stored in the first SRAM cell to the first compare circuitry. The gates of n-type field effect transistors (n-FETs) (T5) and (T6) are galvanically coupled to the terminal WWL (100). A source of the n-FET (T5) is galvanically coupled to the WBLT (101) terminal and a source of the n-FET (T6) is galvanically coupled to the WBLC (131) terminal. A drain of n-FET (T5) is galvanically coupled to the a drain of the n-FET (T2), a drain of the p-FET (T1), a gate of the n-FET (T4), a gate of the p-FET (T3), and a first data bus TRU_1 (106) of the first communicative coupling. A drain of the n-FET (T6) is galvanically coupled to a drain of the p-FET (T3), drain of the n-FET (T4), gate of the p-FET (T1), gate of the n-FET (T2), and a second data bus of the CMP_1 (107) of the first communicative coupling. A source of the p-FET (T1), a source of the p-FET (T3), a source of the n-FET (T2), and a source of the n-FET (T4) are galvanically coupled to a voltage source.

A terminal VDD (102) of the voltage source provides high voltage on the sources of the p-FET (T1) and the p-FET (T3). A terminal VSS (103) of the voltage source provides low voltage on the sources of the n-FET (T2) and the n-FET (T4). Alternatively the terminal VSS (103) can be grounded. Data can be written into the first SRAM cell when a high logic level voltage is applied to the terminal WWL (100), as a result thereof the n-FET transistors (T5) and (T6) are open and data can be written into the first SRAM cell 108. When the data has to be stored in the first SRAM cell a low logic level voltage is applied to the terminal WWL (100). In order to store a logic value (a bit of information) in the first SRAM cell, a voltage level corresponding to a logic value to be stored in the first SRAM cell has to be applied to the terminal WBLT (101) and simultaneously another voltage level corresponding to the inverted logic value to be stored in the first SRAM cell has to be applied to the terminal WBLC (131). For instance when a bit of information being equal to "1" ("0") has to be stored in the first SRAM cell then a high (low) logic level voltage has to be applied to the WBLT (101) terminal and a low (high) logic level voltage has to be applied to the WBLC (131) terminal. When a bit of information being equal to "1" is stored in the first SRAM cell, then the high logic level is on the drain of the n-FET (T5) and all other terminals (of transistors, devices, etc.) being galvanically coupled to the drain of the n-FET (T5) and the low logic level is on the drain of the n-FET (T6) and all other terminals (of transistors, devices, etc.) being galvanically coupled to the drain of the n-FET (T6). When a bit of information being equal to "0" is stored in the first SRAM cell, then the low logic level is on the drain of the n-FET (T5) and all other terminals (of transistors, devices, etc.) being galvanically coupled to the drain of the n-FET (T5) and the high logic level is on the drain of the n-FET (T6) and all other terminals (of transistors, devices, etc.) being galvanically coupled to the drain of the n-FET (T6).

The first compare circuitry comprises eight transistors. A source of the p-FET (T7) is galvanically coupled to the terminal VDD (102). A drain of the p-FET (T7) is galvanically coupled to a source of the p-FET (T8). A drain of the p-FET (T8) is galvanically coupled to a drain of the n-FET (T9), a drain of the p-FET (T12), a drain of the n-FET (T13), and a second communicative coupling BITMCH_2 (110). A source of the n-FET (T9) is galvanically coupled to a drain of the n-FET (T10). The source of the n-FET (T10) is galvanically coupled to the terminal VSS (103). A source of the p-FET (T11) is galvanically coupled to the terminal VDD (102). A drain of the p-FET (T11) is galvanically coupled to a source of the p-FET (T12). A source of the n-FET (T13) is galvanically coupled to a drain of the n-FET (T14). A source of the n-FET (T14) is galvanically coupled to the terminal VSS (103). A gate of the p-FET (T7) is galvanically coupled to the first data bus and a gate of the n-FET (T10). A gate of the p-FET (T11) is galvanically coupled to the second data bus, and a gate of the n-FET (T14). An input terminal CBLT_1 (104) is galvanically coupled to a gate of the p-FET (T8) and a gate of n-FET (T13). An input terminal CBLC_1 (105) is galvanically coupled to a gate of the p-FET (T12) and a gate of the n-FET (T9).

The communicative coupling is BITMCH_2 (110) is galvanically coupled to a first input terminal INPUT_1 (128) of a first logic circuitry (111) comprising a p-FET (T15) and an n-FET (T16). The first input terminal is galvanically coupled to a gate of the n-FET (T16) and a gate of the p-FET (T15). The first communicative coupling can be a galvanic coupling. The second communicative coupling can be a galvanic coupling.

Figure 2:
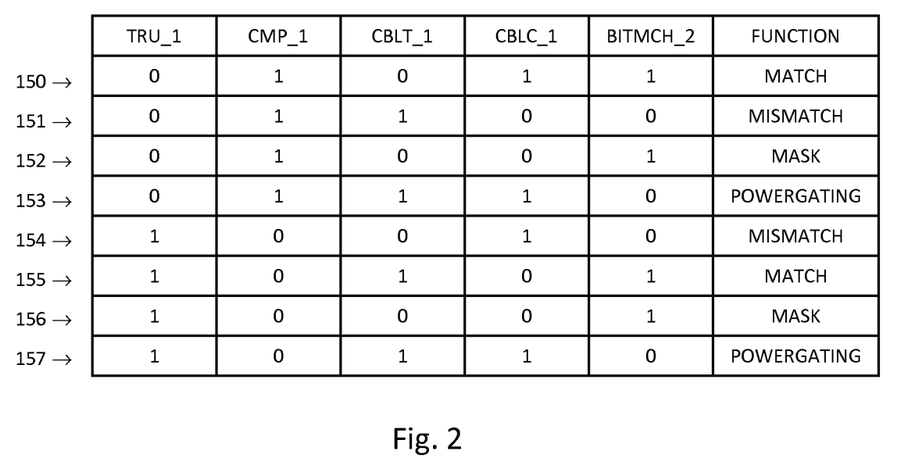
FIG. 2 shows a truth table for operating of compare circuitry of a CAM cell.

A truth table for operation of the first compare circuitry is depicted on a FIG. 2. "0" and "1" represent different binary logic values. "0" binary logic value corresponds to the low logic level voltage and "1" corresponds to the high logic level voltage. A first (TRU_1) and a second (CMP_1) column in the truth table represent binary logical value stored in the first SRAM cell, which are transmitted via the first communicative coupling (106), (107) to the first compare circuitry (109). For instance, when binary logic value stored in the first SRAM cell equals to "0" ("1"), then a "0" ("1") binary logic value is transmitted via the first data bus TRU_1 (106) of the first communicative coupling to the first compare circuitry (109) and a "1" ("0") binary logic value is transmitted via the second data bus CMP_1 (107) of the first communicative coupling to the first compare circuitry (109), as a result thereof a high (low) logic level voltage is applied to the gate of the p-FET (T7) and to the gate of the n-FET (T10) and a low (high) logic level voltage is applied to the gate of the p-FET (T11) and to the gate of the n-FET (T14).

A third (CBLT_1) and a fourth (CBLC_1) column represent match data received by the first compare circuitry via input terminals CBLT_1 (104) and CBLC_1 (105) respectively. A fifth column (BITMCH_2) represents data transmitted via the second communicative coupling to the first logic circuitry. If a binary logic value being equal to "1" ("0") is received on any of these terminals, then a high (low) logic level voltage is applied to the respective gates. If data received via the input terminals CBLT_1 and CBLC_1 matches first data stored in the first SRAM cell, then a binary logic value being equal to "1" is transmitted via the second communicative coupling (109) to the first logic circuitry (see rows (150) and (155) corresponding to a MATCH function). If data received via the input terminals CBLT_1 and CBLC does not match the first data stored in the first SRAM cell, then a binary logic value being equal to "0" is transmitted via the second communicative coupling (109) to the first logic circuitry (see rows (151) and (154) corresponding to a MISMATCH function). The functionality of the first compare logic can be extended by additional functions MASK and power GATING. When data corresponding to MASK data is received via the CBLT_1 and CBLC_1 terminals, then independent of the first data stored in the first SRAM cell, a binary logic value equal to "1" is transmitted via the second communicative coupling (109) to the first input terminal (128) (see rows (152) and (156) corresponding to a MASK function). When a data corresponding to a POWERGATING data is received via the CBLT_1 and CBLC_1 terminals, then independent of the first data stored in the first SRAM cell, a binary logic value being equal to "0" is transmitted via the second communicative coupling (109) to the first input terminal (128) (see rows (153) and (157) corresponding to a POWERGATING function). When a binary logic value being equal to "1" ("0") is received at the first input terminal (128) then a high (low) logic level voltage is applied to the gate of the n-FET (T16) and to the gate of the p-FET (T15).

Figure 3:
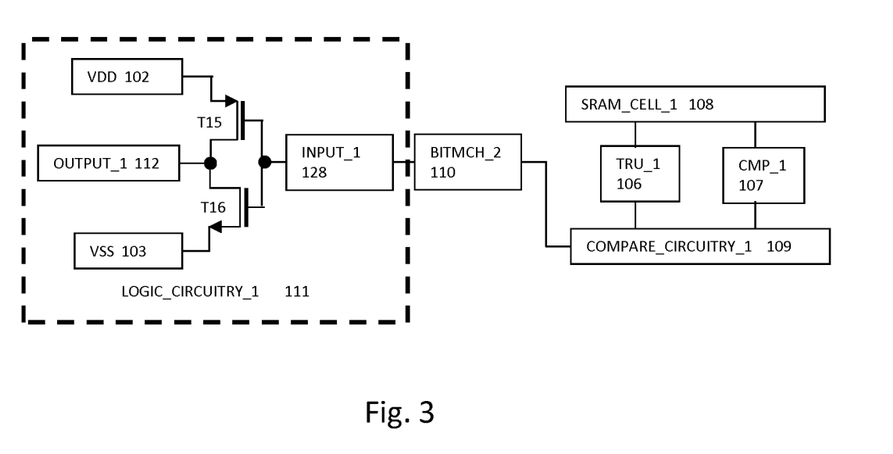
FIG. 3 shows a circuit diagram of a CAM cell.
Figure 4:
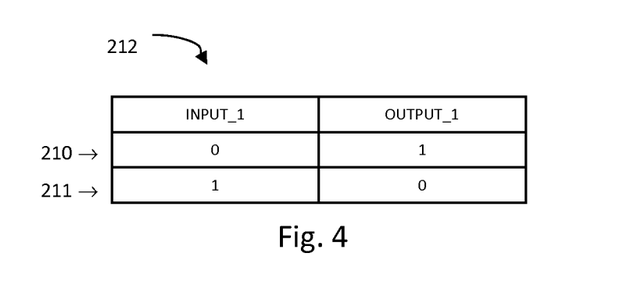
FIG. 4 shows a truth table of an inverter.

FIG. 3 illustrates a CAM cell, wherein the first logic circuitry is configured to perform inverter function. The inverter functionality is implemented by galvanic coupling of a source of the p-FET (T15) to the VDD (102) terminal, galvanic coupling of a source of the n-FET (T16) to the VSS (103) terminal, galvanic coupling of a drain of the p-FET (T15) to the drain of the n-FET (T16) and to a first output terminal (112). The truth table (212) of logic values for the first input terminal (column INPUT_1) and the first output terminal (column INPUT_1) is illustrated on the FIG. 4.

Figure 5:
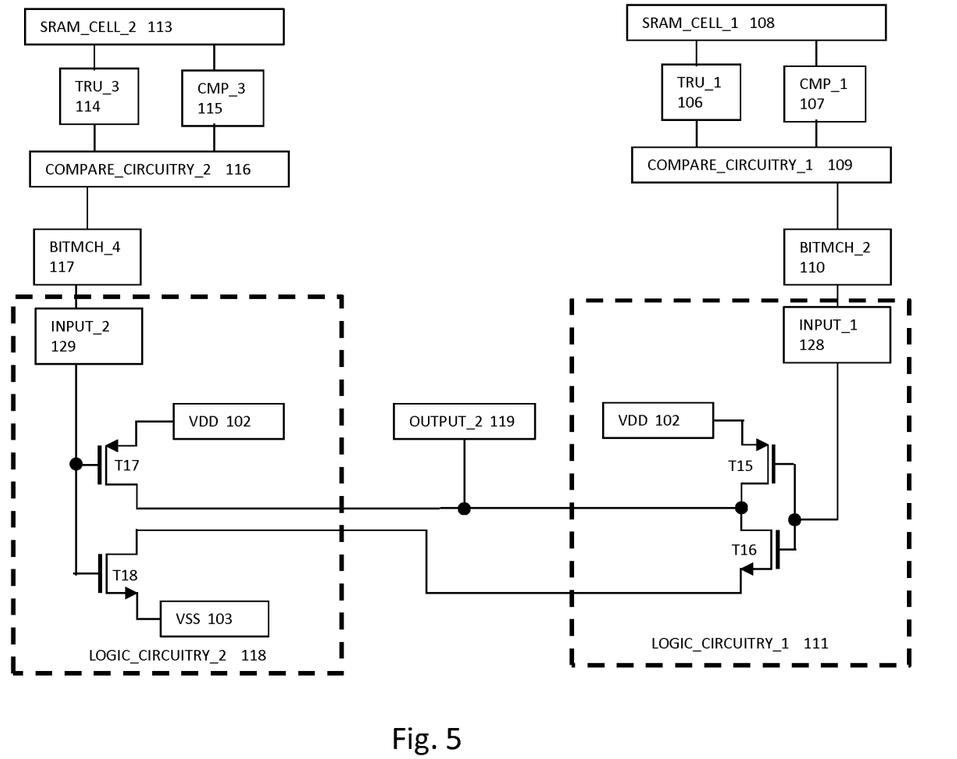
FIG. 5 shows an array of CAM cells.

FIG. 5 illustrates an array comprising two CAM cells. The architecture and functionalities of each of the CAM cells depicted on the FIG. 5 are the same as the structure and the functionalities of the CAM cell depicted on the FIG. 1. The first CAM cell depicted on the FIG. 5 comprises the first SRAM cell (108), the first compare circuitry (109), the first logic circuitry (111), the first communicative coupling (106), (107) for communicative coupling between the first SRAM cell and the first compare circuitry, and the second communicative coupling (110) for communicative coupling between the first compare circuitry (109) and the first input terminal (128) of the first logic circuitry (111). The second CAM cell depicted on the FIG. 5 comprises the second SRAM cell (113), the second compare circuitry (116), the second logic circuitry (118), the third communicative coupling (114), (115) for communicative coupling between the second SRAM cell and the second compare circuitry, and the fourth communicative coupling (117) for communicative coupling between the second compare circuitry (116) and the second input terminal (129) of the second logic circuitry (118).

Figure 6:
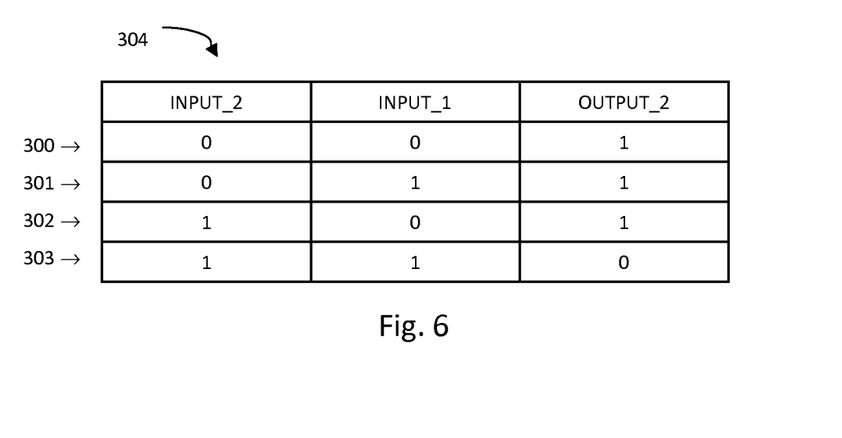
FIG. 6 shows a truth table of NAND logic gate.

The first logic circuitry (111) comprises a p-FET (T15), an n-FET (T16), and the first input terminal (128). The second logic circuitry (118) comprises a p-FET (T17), an n-FET (T18), and the second input terminal (129). The first input terminal is galvanically coupled to a gate of the p-FET (T15) and to a gate of the n-FET (T16). The second input terminal is galvanically coupled to a gate of the p-FET (T17) and to a gate of the n-FET (T18). A source of the p-FET (T15) and a source of the p-FET (T17) are galvanically coupled to the terminal VDD (102). A drain of the p-FET (T15) is galvanically coupled to a drain of the n-FET (T16), a drain of the p-FET (T17), and second output terminal (119) of the CAM cell array. A source of the n-FET (T18) is galvanically coupled to the terminal VSS (103). The terminal VDD (102) and the terminal VSS (103) are galvanically coupled to a voltage supply providing low voltage or ground at the VSS terminal (103) and high voltage at the VDD terminal (102). A drain of the n-FET (T18) is galvanically coupled to a source of the n-FET (T16). The configuration of the first and second logic circuitry depicted on the FIG. 5 functions as a NAND logic gate. A truth table (304) of the NAND logic gate is depicted on the FIG. 6. The first column (INPUT_2) represents binary logical values at the second input terminal (129), the second column (INPUT_1) represents binary logical values at the first input terminal (128), the third column (OUTPUT_2) represents resulting binary logical values at the second output terminal (119).

Figure 7:
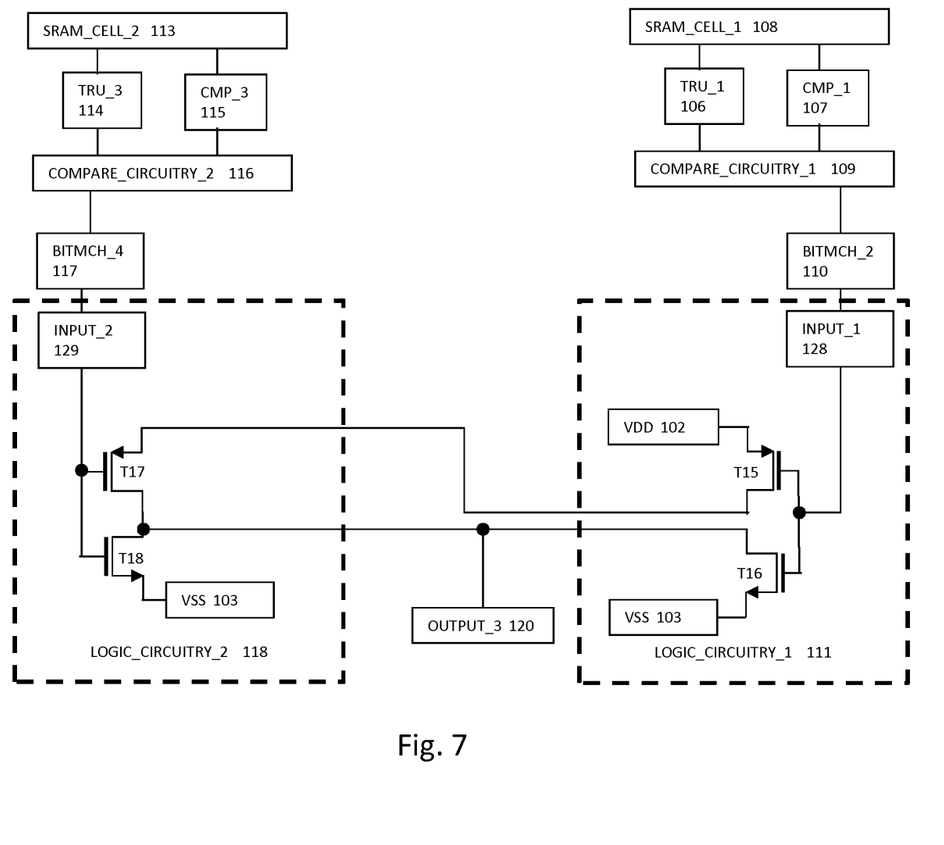
FIG. 7 shows an array of CAM cells.

FIG. 7 illustrates another array comprising two CAM cells. The architecture and functionalities of each of the CAM cells depicted on the FIG. 7 are the same as the structure and the functionalities of the CAM cell depicted on the FIG. 5 but with one exception. Galvanic coupling of transistors of the first (111) and the second (118) logic circuitry is different in comparison with the galvanic couplings of the transistors of the first (111) and second (118) logic circuitry depicted on the FIG. 5. The first input terminal (128) is galvanically coupled to a gate of the p-FET (T15) and to a gate of the n-FET (T16). The second input terminal (129) is galvanically coupled to a gate of the p-FET (T17) and to a gate of the n-FET (T18). A source of the p-FET (T15) is galvanically coupled to the terminal VDD (102). A drain of the p-FET (T15) is galvanically coupled to a source of the n-FET (T17), a drain of the n-FET (T18) is galvanically coupled to a drain of p-FET (T17), a drain of the n-FET (T16), and a third output terminal (120) of the CAM cell array. A source of the p-FET (T15) is galvanically coupled to the terminal VDD (102). A source of the n-FET (T18) and a source of the n-FET (T16) are galvanically coupled to the terminal VSS (103). The terminal VDD (102) and the terminal VSS (103) are galvanically coupled to a voltage supply providing low voltage or ground at the VSS terminal (103) and high voltage at the terminal VDD (102). The configuration of the first (111) and second (118) logic circuitry depicted on the FIG. 7 functions as a NOR logic gate.

Figure 8:
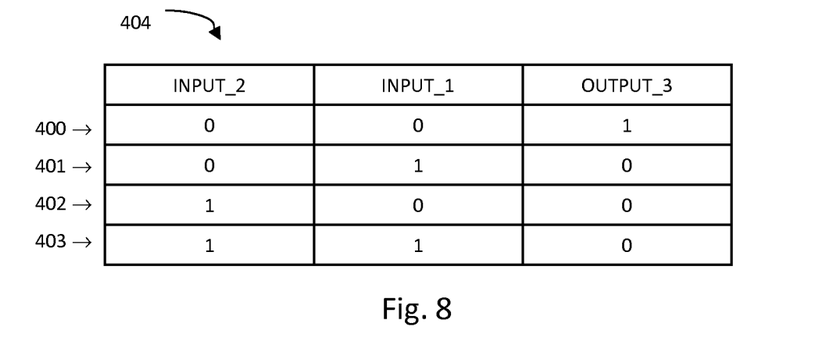
FIG. 8 shows a truth table of NOR logic gate.

A truth table (404) of the NOR logic gate is depicted on the FIG. 8. The first column (INPUT_2) represents binary logical values at the second input terminal (129), the second column (INPUT_1) represents binary logical values at the first input terminal (128), the third column (OUTPUT_3) represents resulting binary logical values at the third output terminal (120).

Figure 9:
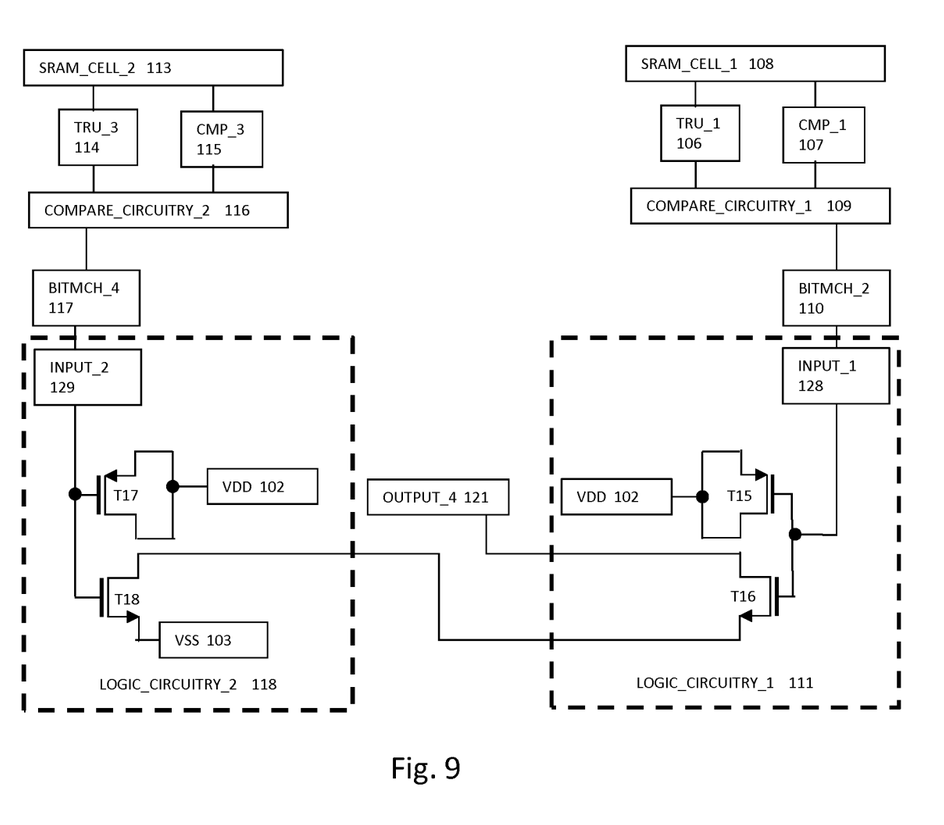
FIG. 9 shows an array of CAM cells.

FIG. 9 illustrates another array comprising two CAM cells. The architecture and functionalities of each of the CAM cells depicted on the FIG. 5 are the same as the structure and the functionalities of the CAM cell depicted on the FIG. 5 but with a couple of exceptions: galvanic coupling of transistors of the first (111) and the second (118) logic circuitry is different in comparison with the galvanic couplings of the transistors of the first (111) and second (118) logic circuitry depicted on the FIG. 5; and the first (118) and the second (111) logic circuitry are dynamic logic circuitries. The n-FET (T18) and n-FET (T16) are not coupled to a voltage supply. The first input terminal (128) is galvanically coupled to a gate of the p-FET (T15) and to a gate of the n-FET (T16). The second input terminal (129) is galvanically coupled to a gate of the p-FET (T17) and to a gate of the n-FET (T18). A source of the p-FET (T15), a drain of the p-FET (T15), a source of the p-FET (T17), and a drain of the p-FET (T17) are galvanically coupled to the terminal VDD (102). A drain of the n-FET (T18) is galvanically coupled to a source of the n-FET (T16), a drain of the n-FET (T16) is galvanically coupled to an fourth output terminal (121). A source of the n-FET (T18) is galvanically coupled to the terminal VSS (103). The terminal VDD (102) and the terminal VSS (103) are galvanically coupled to the voltage supply providing low voltage or ground at the VSS terminal (103) and high voltage at the VDD terminal (102). The first and the second logic circuitry can operate as a pull down dynamic circuitry, i.e. it can discharge a capacitance of the fourth output terminal down to a low logic level. Another transistor configured to provide galvanic coupling between the fourth output port and the terminal VDD (102) can be used as pull up transistor of said array. The pull up transistor charges the capacitance of the fourth output terminal up to the high logic level. The pull down dynamic circuitry and the pull up transistor operate in non-overlapping time intervals. For instance, in a first time interval the capacitance of the fourth output port is charged up to the high logic level via the pull up transistor. Afterwards, in the second time interval the first and the second logic circuitry are operated. The sequence of the first and the second time intervals can be repeated consecutively. The configuration of the first (111) and second (118) dynamic logic circuitry depicted on the FIG. 9 functions as a NAND logic gate.

Dynamic logic (or sometimes clocked logic), as understood here is a design methodology in combinatory logic circuits, particularly those implemented in MOS technology. It is distinguished from the so-called static logic by exploiting temporary storage of information in stray and gate capacitances. The largest difference between static and dynamic logic is that in dynamic logic, a clock signal is used to evaluate/program a state of the dynamic logic.

Figure 10:
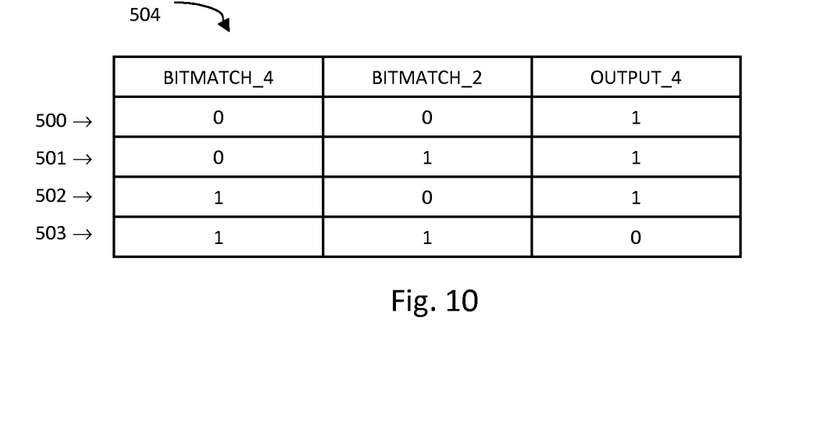
FIG. 10 shows a truth table of NAND logic gate.

A truth table (504) of the NAND logic gate is depicted on the FIG. 10. The first column (INPUT_2) represents binary logical values at the second input terminal (129), the second column (INPUT_1) represents binary logical values at the first input terminal (128), the third column (OUTPUT_4) represents resulting binary logical values at the third output terminal (120).

Figure 11:
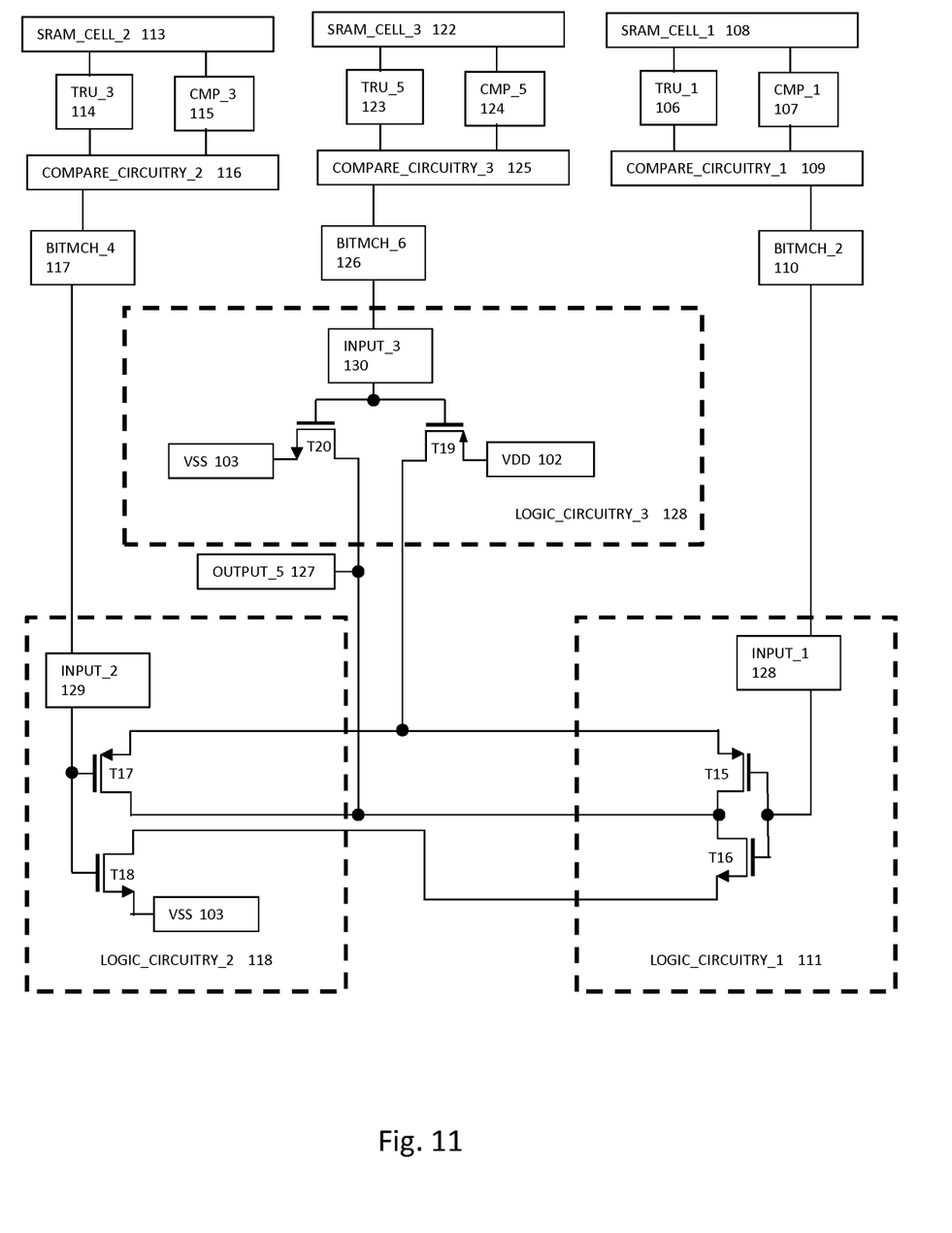
FIG. 11 shows an array of CAM cells.

FIG. 11 illustrates an array comprising three CAM cells. The architecture and functionalities of each of the CAM cells depicted on the FIG. 11 are the same as the structure and the functionalities of the CAM cell depicted on the FIG. 1. The first CAM cell depicted on the FIG. 11 comprises a first SRAM cell (108), a first compare circuitry (109), a first logic circuitry (111), a first communicative coupling (106), (107) for communicative coupling between the first SRAM cell and the first compare circuitry, and a second communicative coupling (110) for communicative coupling between the first compare circuitry (109) and the first input terminal (128) of the first logic circuitry (111). The second CAM cell depicted on the FIG. 11 comprises a second SRAM cell (113), a second compare circuitry (116), a second logic circuitry (118), a third communicative coupling (114), (115) for communicative coupling between the second SRAM cell and the second compare circuitry, and a fourth communicative coupling (117) for communicative coupling between the second compare circuitry (116) and the second input terminal (129) of the second logic circuitry (118). The third CAM cell depicted on the FIG. 11 comprises a third SRAM cell (122), a third compare circuitry (125), a third logic circuitry (128), the fifth communicative coupling (123), (124) for communicative coupling between the third SRAM cell and the third compare circuitry, and a sixth communicative coupling (126) for communicative coupling between the third compare circuitry (125) and the third input terminal (130) of the third logic circuitry (128).

The first logic circuitry (111) comprises a p-FET (T15), an n-FET (T16), and the first input terminal (128). The second logic circuitry (118) comprises a p-FET (T17), an n-FET (T18), and the second input terminal (129). The third logic circuitry (128) comprises a p-FET (T19), an n-FET (T20), and the third input terminal (130). The first input terminal is galvanically coupled to a gate of the p-FET (T15) and to a gate of the n-FET (T16). The second input terminal is galvanically coupled to a gate of the p-FET (T17) and to a gate of the n-FET (T18). The third input terminal is galvanically coupled to a gate of the p-FET (T19) and to a gate of the n-FET (T20). A source of the p-FET (T19) is galvanically coupled to the terminal VDD (102). A drain of the p-FET (T19) is galvanically coupled to a source of the p-FET (T15) and a source of the p-FET (T17), a drain of the n-FET (T20) is galvanically coupled to a fifth output terminal (127) of the CAM cell array, a drain of the p-FET (T15), a drain of the n-FET (T16), and a drain of the n-FET (T17). A source of the n-FET (T18) is galvanically coupled to the terminal VSS (103). The terminal VDD (102) and the terminal VSS (103) are galvanically coupled to a voltage supply providing low voltage or ground at the VSS terminal (103) and high voltage at the VDD terminal (102). A drain of the n-FET (T18) is galvanically coupled to a source of the n-FET (T16). The configuration of the first, second, and third logic circuitry depicted on the FIG. (111) functions as a AND-OR-Invert (AOI) logic gate.

Figure 12:
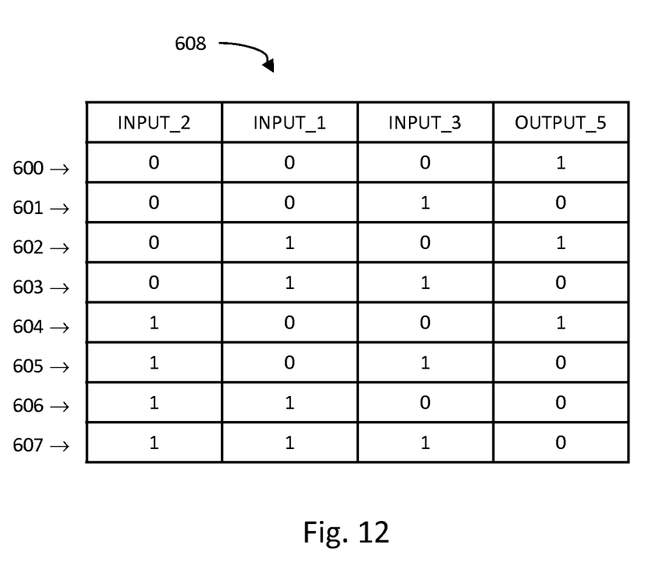
FIG. 12 shows a truth table of AOI logic gate.

A truth table of the AOI logic gate is depicted on the FIG. 12. The first column (INPUT_2) represents binary logical values at the second input terminal (129). The second column (INPUT_1) represents binary logical values at the first input terminal (128). The third column (INPUT_3) represents binary logical values at the third input terminal (130). The fourth column (OUTPUT_5) represents resulting binary logical values at the fifth output terminal (127).

As it is clearly seen from the description above various logic gates can be implemented by minor modifications in the respective first, second, and third logic circuitries. This feature enables a unique opportunity to implement the galvanic couplings of terminals of transistors of the first and second logic circuitries using a proper first metal wiring layout and a proper layout of heavily/degenerately doped regions of semiconductor wafer.

Figure 13:
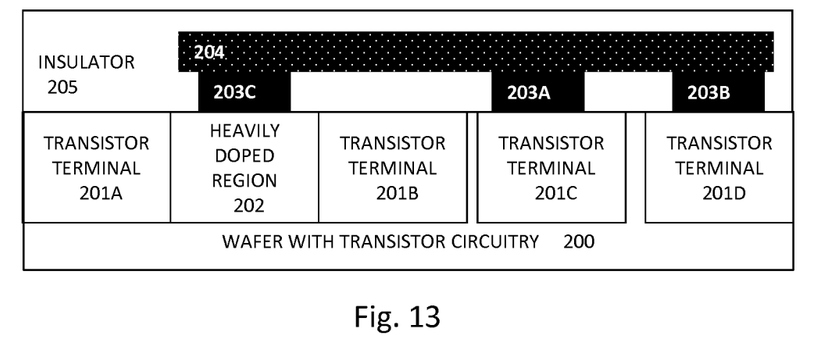
FIG. 13 shows a cross-section of the integrated circuit.

FIG. 13 illustrates an example fragment of these galvanic couplings. A semiconductor wafer (200) comprises transistor circuitry used for implementation of the CAM cells. The transistors of the CAM cells have transistor terminals (201A-D) for electrical connection to the respective sources, drains, and gates of the transistors. The transistor terminals (201A) and (201B) are galvanically coupled by a heavily/degenerately doped portion (202) of the wafer. A first metal wiring layer is used for providing galvanic couplings between transistor terminals and heavily/degenerately doped portions of the wafer. The first metal wiring layer consists of vertical metallic vias (203A-C) being in electrical and physical contacts with the respective transistor terminals and the respective heavily/degenerately doped portions of the wafer. The metallic vias a oriented in a direction perpendicular to a surface of the wafer. Groups of the metallic vias are in electrical and physical contact with respective metallic wiring paths (204) being parallel the wafer surface.

The CAM cells and arrays comprising CAM cells have a very compact layout on the wafer (200). The CAM cells depicted on the FIGS. 1 and 3 can have a layout as depicted on FIG. 14. The first SRAM cell is implemented on a first portion (108a) of the wafer. The first compare circuitry is implemented on a second portion (109a) of the wafer. The first logic circuitry is implemented on the third portion (111a) of the wafer. The second portion is adjacent to the first and the third portion.

Figure 14:
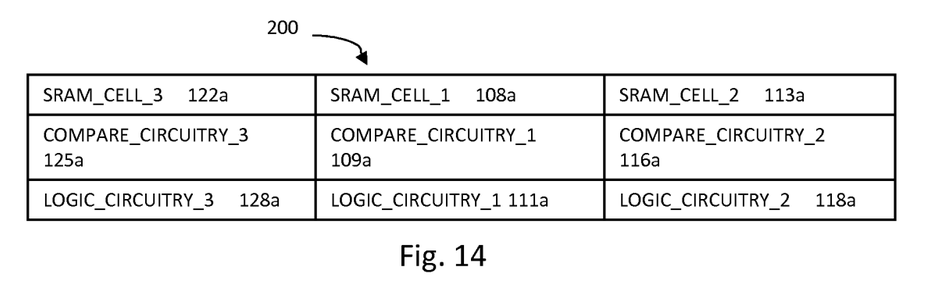
FIG. 14 shows a layout of a CAM cell array.

The CAM cell arrays depicted on the FIGS. 5, 7 and 9 can have a layout as depicted on FIG. 14. The first SRAM cell is implemented on a first portion (108a) of the wafer. The first compare circuitry is implemented on a second portion (109a) of the wafer. The first logic circuitry is implemented on the third portion (111a) of the wafer. The second SRAM cell is implemented on a fourth portion (113a) of the wafer. The second compare circuitry is implemented on a fifth portion (116a) of the wafer. The second logic circuitry is implemented on the sixth portion (118a) of the wafer. The third portion is adjacent to the sixth portion. The second portion can be adjacent to the first and the third portion. The fifth portion can be adjacent to the fourth and the sixth portion. The fifth portion can be adjacent to the second portion. The first portion can be adjacent to the fourth portion.

The CAM cell array depicted on the FIG. 11 can have a layout as depicted on FIG. 14. The first SRAM cell is implemented on a first portion (108a) of the wafer. The first compare circuitry is implemented on a second portion (109a) of the wafer. The first logic circuitry is implemented on the third portion (111a) of the wafer. The second SRAM cell is implemented on a fourth portion (113a) of the wafer. The second compare circuitry is implemented on a fifth portion (116a) of the wafer. The second logic circuitry is implemented on the sixth portion (118a) of the wafer. The third SRAM cell is implemented on a seventh portion (122a) of the wafer. The third compare circuitry is implemented on an eighth portion (125a) of the wafer. The third logic circuitry is implemented on the ninth portion (128a) of the wafer. The third portion is adjacent to the sixth and the ninth portion. The second portion can be adjacent to the first and the third portion. The fifth portion can be adjacent to the fourth and the sixth portion. The eighth portion can be adjacent to the seventh and the ninth portion. The fifth portion can be adjacent to the eights and the second portion. The first portion can be adjacent to the fourth portion. The first portion can be adjacent to the fourth and the seventh portion.

Figure 15:
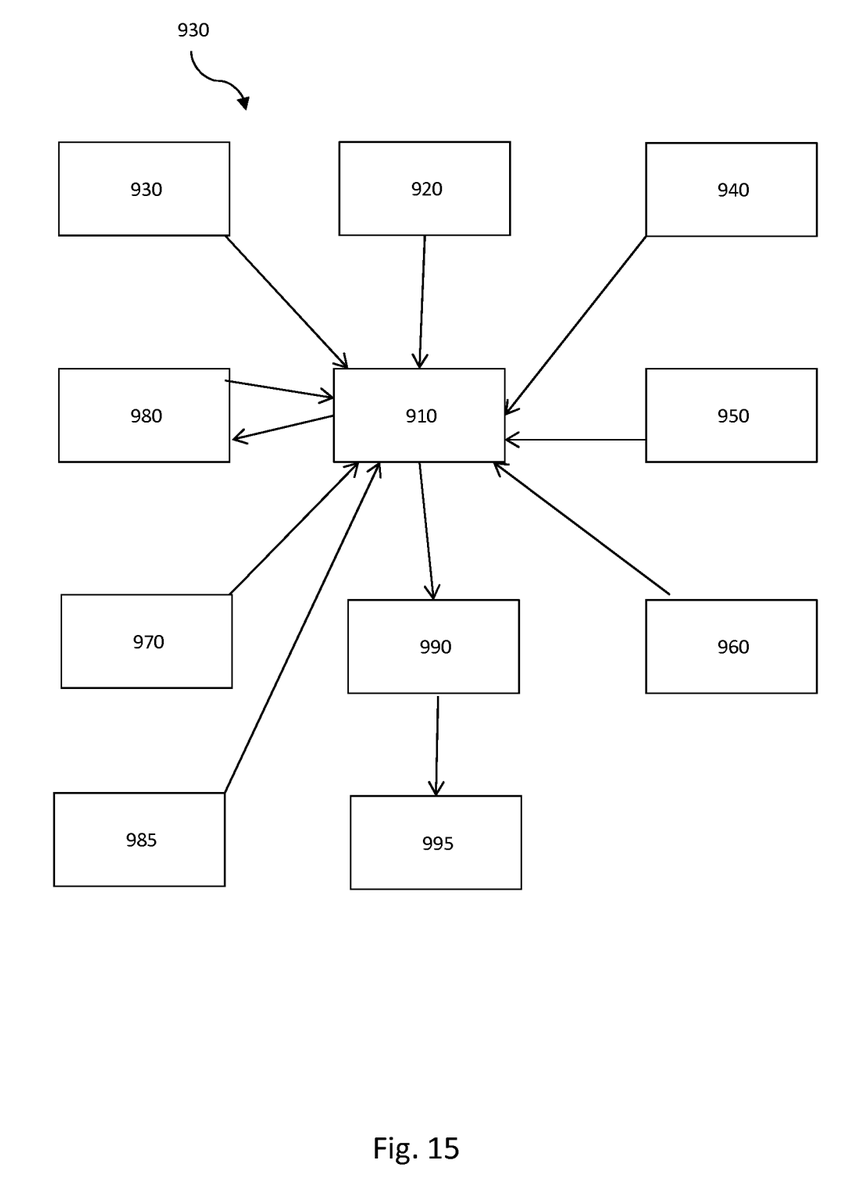
FIG. 15 shows a flow diagram of a design process used in semiconductor design, manufacture, and/or test.

FIG. 15 is a flow diagram of a design process used in semiconductor design, manufacture, and/or test. FIG. 15 shows a block diagram of an exemplary design flow (900) used for example, in semiconductor IC logic design, simulation, test, layout, and manufacture. Design flow (900) includes processes, machines and/or mechanisms for processing design structures or devices to generate logically or otherwise functionally equivalent representations of the design structures and/or devices described above and shown in FIGS. 1-8. The design structures processed and/or generated by design flow (900) may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow (900) may vary depending on the type of representation being designed. For example, a design flow (900) for building an application specific IC (ASIC) may differ from a design flow (900) for designing a standard component or from a design flow (900) for instantiating the design into a programmable array, for example a programmable gate array (PGA) or a field programmable gate array (FPGA) offered by Altera® Inc. or Xilinx® Inc.

FIG. 15 illustrates multiple such design structures including an input design structure (920) that is preferably processed by a design process (910). Design structure (920) may be a logical simulation design structure generated and processed by design process (910) to produce a logically equivalent functional representation of a hardware device. Design structure (920) may also or alternatively comprise data and/or program instructions that when processed by design process (910), generate a functional representation of the physical structure of a hardware device. Whether representing functional and/or structural design features, design structure (920) may be generated using electronic computer-aided design (ECAD) such as implemented by a core developer/designer. When encoded on a machine-readable data transmission, gate array, or storage medium, design structure (920) may be accessed and processed by one or more hardware and/or software modules within design process (910) to simulate or otherwise functionally represent an electronic component, circuit, electronic or logic module, apparatus, device, or system such as those shown in FIGS. 1, 3, 5, 7, 9, 11, 13, and 14. As such, design structure (920) may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process (910) preferably employs and incorporates hardware and/or software modules for synthesizing, translating, or otherwise processing a design/simulation functional equivalent of the components, circuits, devices, or logic structures shown in FIGS. 1, 3, 5, 7, and 9 to generate a netlist (980) which may contain design structures such as design structure (920). Netlist (980) may comprise, for example, compiled or otherwise processed data structures representing a list of wires, discrete components, logic gates, control circuits, I/O devices, models, etc. that describes the connections to other elements and circuits in an integrated circuit design. Netlist (980) may be synthesized using an iterative process in which netlist (980) is resynthesized one or more times depending on design specifications and parameters for the device. As with other design structure types described herein, netlist (980) may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process (910) may include hardware and software modules for processing a variety of input data structure types including netlist (980). Such data structure types may reside, for example, within library elements (930) and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications (940), characterization data (950), verification data (960), design rules (970), and test data files (985) which may include input test patterns, output test results, and other testing information. Design process (910) may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process (910) without deviating from the scope and spirit of the invention. Design process (910) may also include modules for performing standard circuit design processes such as timing analysis, verification, design rule checking, place and route operations, etc.

Design process (910) employs and incorporates logic and physical design tools such as HDL compilers and simulation model build tools to process design structure (920) together with some or all of the depicted supporting data structures along with any additional mechanical design or data (if applicable), to generate a second design structure (990).

Design structure (990) resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure (920), design structure (990) preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1, 3, 5, 7, 9, 11, 13, and 14. In one embodiment, design structure (990) may comprise a compiled, executable HDL simulation model that functionally simulates the devices shown in FIGS. 1, 3, 5, 7, and 9.

Design structure (990) may also employ a data format used for the exchange of layout data of integrated circuits and/or symbolic data format (e.g. information stored in a GDSII (GDS2), GL1, OASIS, map files, or any other suitable format for storing such design data structures). Design structure (990) may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-8.

Design structure (990) may then proceed to a stage (995) where, for example, design structure (990): proceeds to tape-out, is released to manufacturing, is released to a mask house, is sent to another design house, is sent back to the customer, etc.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising" when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The foregoing description has been presented for purposes of illustration and description, but is not intended to be exhaustive or limited in the form disclosed. Many modifications and variations will be apparent to those of ordinary skill in the art without departing from the scope and spirit of the embodiments. The embodiment was chosen and described in order to best explain the principles of the invention and the practical application, and to enable others of ordinary skill in the art to understand the invention for various embodiments with various modifications as are suited to the particular use contemplated. Accordingly, while the invention has been described in terms of embodiments, those of skill in the art will recognize the embodiments can be practiced with modifications and in the spirit and scope of the appended claims.

We claim:

1. A content addressable memory (CAM) cell comprising:
a first memory cell comprising a first coupling having a first data bus and a second data bus;
a first logic circuitry comprising a pair of transistors consisting of: a first n-type field effect transistor (n-FET), a first p-type field effect transistor (p-FET), and the first logic circuitry further comprising a first output terminal and a first input terminal, wherein a gate of the first n-FET and a gate of the first p-FET are galvanically coupled to the first input terminal; and
a first compare circuitry comprising a plurality of transistors communicatively coupled to the first memory cell via the first coupling, and to the first input terminal via a second coupling, wherein an arrangement of the transistors in the first compare circuitry is configured to:
receive first data stored in the first memory cell via the first coupling;
receive first match data;
transmit a first binary logical value to the first input terminal via the second coupling in response to the first data not matching the first match data; and
transmit a second binary logical value to the first input terminal via the second coupling in response to the first data matching the first match data;
a first match data input terminal and a second match data input terminal communicatively coupled to the first compare circuitry, wherein the first compare circuitry is further configured to:
receive mask data and powergating data from the first and second match data input terminals; and
in response to receipt of the mask data, transmit the first binary logical value to the first input terminal via the second coupling, and in response to receipt of the powergating data, transmit the second binary logical value to the first input terminal via the second coupling.

2. The CAM cell of claim 1, further comprising the first logic circuitry configured to receive the first and second binary logical values via the first input terminal, invert the first and second binary logical values to create inverted binary logical values, and output the inverted binary logical values via a first output terminal.

3. The CAM cell of claim 1, wherein the first binary logical value and the second binary logical value are inverted.

4. The CAM cell of claim 3, further comprising the first match data input terminal and the second match data input terminal communicatively coupled to the compare circuitry, wherein the first match data input terminal inputs the first match data and the second match data input terminal inputs second match data, wherein the arrangement of the transistors in the first compare circuitry is further configured to:
transmit the first binary logical value to the first input terminal via the second coupling in response to one of the first data not matching the first match data and the second data not matching the second match data; and
transmit the second binary logical value to the first input terminal via the second coupling in response to the first data matching the first match data and the second data matching the second match data.

5. The CAM cell of claim 3, further comprising the first match data input terminal and the second match data input terminal communicatively coupled to the compare circuitry, wherein the first match data input terminal inputs the first match data and the second match data input terminal inputs second match data, wherein the arrangement of the transistors in the first compare circuitry is further configured to:
transmit the second binary logical value to the first input terminal via the second coupling in response to the first match data and the second match data being a first predetermined mask data; and
transmit the first binary logical value to the first input terminal via the second coupling in response to the first match data and the second match data being a first predetermined powergating data.

6. The CAM cell of claim 1, wherein resistance of the galvanic coupling is between 0 Ohm and 10 Ohm.

7. The CAM cell of claim 1, further comprising:
a second memory cell comprising a third coupling having a third data bus and a fourth data bus;
a second logic circuitry consisting of: a second n-FET, a second p-FET, and a second input terminal, wherein a gate of the second n-FET and a gate of the second p-FET are galvanically coupled to the second input terminal; and
a second compare circuitry comprising a plurality of transistors communicatively coupled to the second memory cell via the third coupling, and to the second input terminal via a fourth coupling, an arrangement of the transistors in the second compare circuitry configured to:
receive third data from the second memory cell via the third data bus, and third match data from a third match data input terminal;
receive fourth data from the second memory cell via the fourth data bus, and fourth match data from a fourth match data input terminal;
compare the third data and the third match data; and
compare the fourth data and the fourth match data.

8. The CAM cell of claim 7, wherein the arrangement of the transistors in the second compare circuitry is further configured to:
transmit a third binary logical value to the second input terminal via the fourth coupling in response to one of the third data not matching the third match data and the fourth data not matching the fourth match data; and
transmit a fourth binary logical value to the second input terminal via the fourth coupling in response to the third data matching the third match data and the fourth data matching the fourth match data.

9. The CAM cell of claim 8, further comprising a second output terminal, wherein:
a drain of the first p-FET is galvanically coupled to the second output terminal, a drain of the second p-FET, and a drain of the first n-FET;
a drain of the second n-FET is galvanically coupled to a source of the first n-FET; and
a source of the second p-FET and a source of the first p-FET is galvanically coupled to a first voltage source, and a source of the second n-FET is galvanically coupled to a second voltage source.

10. The CAM cell of claim 7, further comprising: a third output terminal, wherein:
a drain of the first n-FET is galvanically coupled to the third output terminal, a drain of the second p-FET, and a drain of the second n-FET;
a drain of the first p-FET is galvanically coupled to a source of the second p-FET;
a source of the first p-FET is galvanically coupled to a first voltage source, and a source of the first n-FET and a source of the second n-FET are galvanically coupled to a second voltage source.

11. The CAM cell of claim 7, further comprising a fourth output terminal, wherein:
a drain of the first n-FET is galvanically coupled to the fourth output terminal;
a source and a drain of the first and second p-FET are galvanically coupled to a first voltage source; and
the drain of the second n-FET is galvanically coupled to the source of the first n-FET.

12. The CAM cell of claim 7, further comprising:
a third memory cell comprising a fifth coupling having a fifth data bus and a sixth data bus;
a third logic circuitry comprising a third n-FET, a third p-FET, and a third input terminal, wherein a gate of the third n-FET and a gate of the third p-FET are galvanically coupled to the third input terminal; and
a third compare circuitry comprising a plurality of transistors communicatively coupled to the third memory cell via a fifth coupling, and to the third input terminal via a sixth coupling, an arrangement of the transistors in the third compare circuitry configured to:
receive fifth data from the third memory cell via the fifth data bus, and fifth match data from a fifth match data input terminal;
receive sixth data from the third memory cell via the sixth data bus, and sixth match data from a sixth match data input terminal;
transmit the first binary logical value to the third input terminal via the sixth coupling in response to one of the fifth data not matching the fifth match data and the sixth data not matching the sixth match data; and
transmit the second binary logical value to the third input terminal via the sixth coupling in response to the fifth data matching the fifth match data and the sixth data matching the sixth match data.

13. The CAM cell of claim 12, further comprising a fifth output terminal, including:
the drain of the first p-FET, the drain of the first n-FET, the drain of the second p-FET, and a drain of the third n-FET are galvanically coupled to the fifth output terminal;
a drain of the third p-FET galvanically coupled to the source of the first p-FET and the source of the second p-FET;
the drain of the second n-FET galvanically coupled to the source of the first n-FET; and
a source of the third p-FET is galvanically coupled to a first voltage source, and a source of the third n-FET is galvanically coupled to a second voltage source.

14. The CAM cell of claim 1, wherein the first logic circuitry performs an inverter function.

15. The CAM cell of claim 1, wherein the inverter function is implemented by coupling a drain of the first p-FET to a drain of the first n-FET.

16. The CAM cell of claim 1, wherein transmission of the first binary logical value is represented with a first binary symbol and transmission of the second binary logical value is represented with a second binary symbol.

17. The CAM cell of claim 16, wherein the first and second binary symbols are different.

18. The CAM cell of claim 16, wherein transmission of the first and second binary logical symbols of the first compare circuitry in response to receipt of one of the mask and powergating data is independent of data stored in the first memory cell.

19. A content addressable memory (CAM) cell comprising:
a first memory cell;
a first logic circuitry comprising a first n-type field effect transistor (n-FET), a first p-type field effect transistor (p-FET), and a first input terminal, wherein a gate of the first n-FET and a gate of the first p-FET are galvanically coupled to the first input terminal; and
a first compare circuitry communicatively coupled to the first memory cell via the first coupling and to the first input terminal via a second coupling, wherein the first compare circuitry is configured to:
receive first data stored in the first memory cell via the first coupling;

receive first match data;
transmit a first binary logical value to the first input terminal via the second coupling in response to the first data not matching the first match data; and
transmit a second binary logical value to the first input terminal via the second coupling in response to the first data matching the first match data; and
the first compare circuitry further configured to:
  receive mask data from the first and second input terminals, and transmit the first binary logical value to the first input terminal via the second coupling in response to receiving the mask data;
  receive powergating data from the first and second input terminals, and transmit the second binary logical value to the first input terminal via the second coupling in response to receiving the powergating data, wherein the second binary logical value is different from the first binary logical value; and
  wherein the mask data and powergating data override the received first data.

* * * * *